United States Patent [19]
Sippel

[11] Patent Number: 5,680,701
[45] Date of Patent: Oct. 28, 1997

[54] FABRICATION PROCESS FOR CIRCUIT BOARDS

[75] Inventor: Gerhard Sippel, Gaertringen, Germany

[73] Assignee: International Business Machines Corporation, Armonk, N.Y.

[21] Appl. No.: 470,560

[22] Filed: Jun. 6, 1995

Related U.S. Application Data

[62] Division of Ser. No. 88,659, Jul. 6, 1993.

[30] Foreign Application Priority Data

Aug. 26, 1992 [DE] Germany ............... 92 114 507.4

[51] Int. Cl.⁶ ...................................................... H01K 3/10
[52] U.S. Cl. ........................................... 29/852; 427/97
[58] Field of Search ............ 29/846, 852; 427/96; 156/656

[56] References Cited

U.S. PATENT DOCUMENTS

| | | |
|---|---|---|
| 3,672,986 | 6/1972 | Schneble, Jr. et al. |
| 3,799,802 | 3/1974 | Schneble, Jr. et al. ............... 427/97 |
| 3,799,816 | 3/1974 | Schneble, Jr. et al. |
| 4,325,780 | 4/1982 | Schulz, Sr. ............... 427/97 X |
| 4,389,278 | 6/1983 | Kai ............... 427/97 X |
| 4,486,466 | 12/1984 | Leech et al. ............... 427/97 X |
| 4,487,654 | 12/1984 | Coppin ............... 427/97 X |
| 4,512,829 | 4/1985 | Ohta et al. ............... 427/97 X |
| 4,720,324 | 1/1988 | Hayward ............... 427/97 X |
| 4,931,148 | 6/1990 | Kukanskis et al. ............... 427/97 X |
| 5,160,579 | 11/1992 | Larson ............... 427/97 X |

FOREIGN PATENT DOCUMENTS

| | | |
|---|---|---|
| 0160966 | 11/1985 | European Pat. Off. . |
| 0208023 | 1/1987 | European Pat. Off. . |
| 2232908 | 6/1974 | France . |

OTHER PUBLICATIONS

Patent Abstracts of Japan vol. 14, No. 182 Apr. 12, 1990 "Manufacture of Printed Wiring Board".
Patent Abstracts of Japan vol. 14, No. 22 Jan. 17, 1990 "Manufacture of Printed Wiring Board".

*Primary Examiner*—Carl J. Arbes
*Attorney, Agent, or Firm*—Michael E. Belk; Bernard Tiegerman

[57] ABSTRACT

A process with several variants is presented which permits the layer thickness of the conductive layers on a circuit board to be independent of the layer thickness of the conductive layers in the holes. To this end, the surface structure of the circuit board, in particular the conductors, are initially completed, covered with a solder stop mask, and it is only then that the holes bared by exposure and development of the solder stop mask and, if required, lands and pads, are metallized.

32 Claims, 6 Drawing Sheets

FABRICATION PROCESS FOR CIRCUIT BOARDS

This is a division of co-pending application Ser. No. 08/088,659 filed Jul. 6, 1993, entitled "Circuit Board and Fabrication Process for Circuit Boards".

FIELD

The invention concerns circuit boards and a process for their fabrication.

BACKGROUND

Hitherto, circuit boards have been fabricated such that what is known as the inner layers, i.e. the conductive regions of the circuit board, are built from horizontal as well as vertical sandwiched insulating layers. For this purpose, various processes may be used which are described, for example, in "Handbuch der Leiterplattentechnik", Vol. 2, 1991, E.G. Leuze Verlag, Saulgau, Germany.

Such a substrate, which is normally fabricated by lamination, is coated either unilaterally and bilaterally with a metal, generally a copper foil.

Subsequently, through and/or blind holes are drilled into the metal-coated substrate and cleaned from drilling residue.

Then the holes in the substrate as well as the surface (full panel plate) or only the image pattern (pattern plate) are generally subjected to an electrodeposition of metal in, say, a copper bath. On the surface, metal is thus deposited on the metal foil, whereas in the holes it is applied directly to the substrate consisting of conductor planes and insulating material.

The substrate surface is blanket-coated with photoresist which is exposed and developed to form a pattern, while the region of the holes is "tented", meaning that the holes are covered with photoresist. Thus, the future conductors are defined in the remaining surface regions.

In the next step, the metal, i.e., the electrodeposited layer and the foil, is removed, for example, by etching, and the photoresist is stripped, retaining the metal protected by "tenting" in the holes and that protected by photoresist in the remaining regions.

In the last step, a solder stop mask is applied to the surface of the substrate, exposed and developed. This may be followed by a test and separating steps.

In this manner circuit boards are obtained, wherein the metal layer thicknesses on the circuit board surface and in the holes are dependent on each other. As a predetermined minimum layer thickness of metal must exist in the holes, this process using thick metal layers on the surface (metal foil and electrodeposited metal) is hardly suitable for fabricating fine-line products such as those with conductor widths of less than about 75 μm (about 3 mil).

SUMMARY OF THE INVENTION

It is the object of the invention to render the metallization of the holes independent of that on the surface.

This object is accomplished according to the invention in that after the holes have been formed in the substrate and prior to depositing the conductive material in the holes, a solder stop mask is applied to the surface of the substrate, exposed and developed.

The novel process permits the fabrication of circuit boards with conductors of a conductive material and with holes coated with a conductive material, wherein the layer thickness of the conductive material on one surface of the circuit board is independently selectable of the layer thickness of the conductive material in the holes.

Thus, fine-line circuit boards may be fabricated, wherein the layer thickness of the conductive material on the surface of the circuit board is about 10 to 40 μm and the layer thickness of the conductive material in the holes and 5 to 30 μm, and wherein the layer thickness of the conductive material on the surface of the circuit board is preferably about 15 to 18 μm and the layer thickness of the conductive material in the holes is preferably about 23 to 28 μm.

The inventive process and several variants are described in detail below with reference to drawings.

BRIEF DESCRIPTION OF THE DRAWINGS

FIGS. 4A, 4B, 4C and 4D are steps of the process variants of the invention of FIGS. 1–3, wherein the thickness of the conductive material deposited in the through hole is independent of the thickness of the conductive metal on the surface of the circuit board.

DETAILED DESCRIPTION OF THE DRAWINGS

Figure 1A:
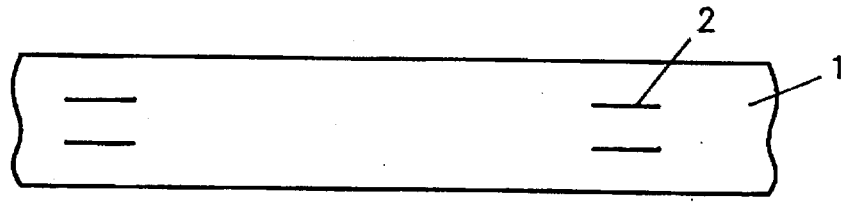
FIGS. 1A, 1B, 1C, 1D, 1E, 1F, 1G and 1H are steps a schematic of a process variant, wherein the hole is formed prior to completion of the conductors.
Figure 1B:
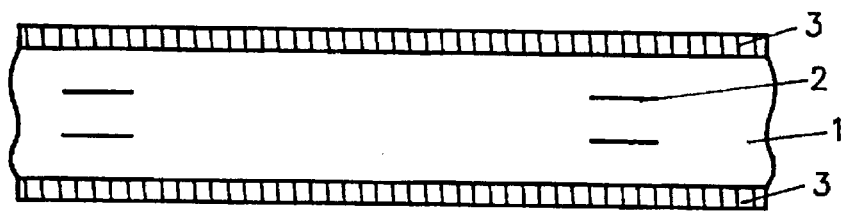
Figure 1C:
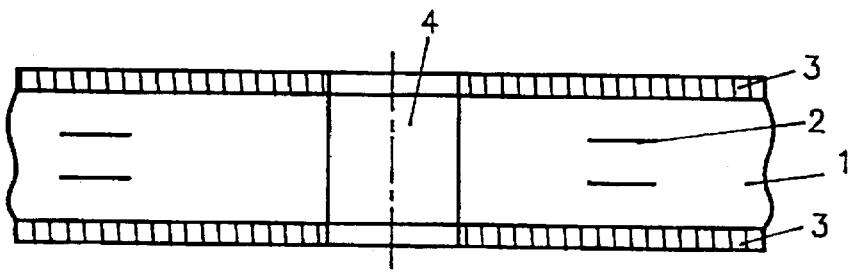
Figure 1D:
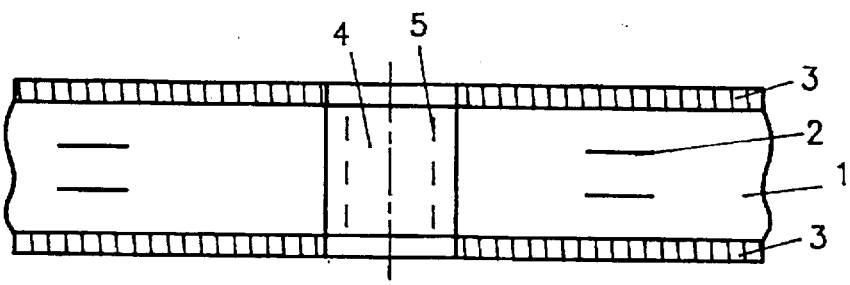
Figure 1E:
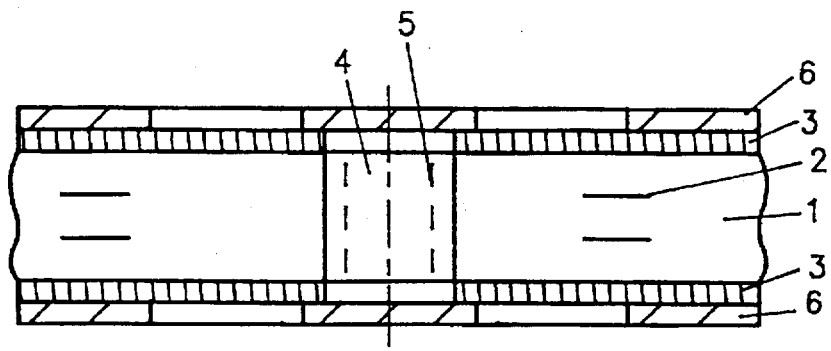
Figure 1F:
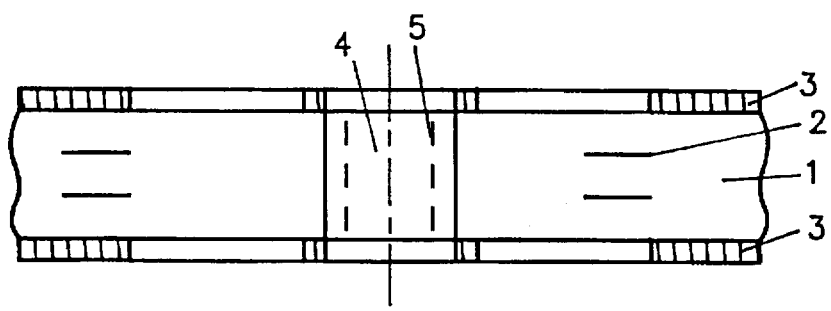
Figure 1G:
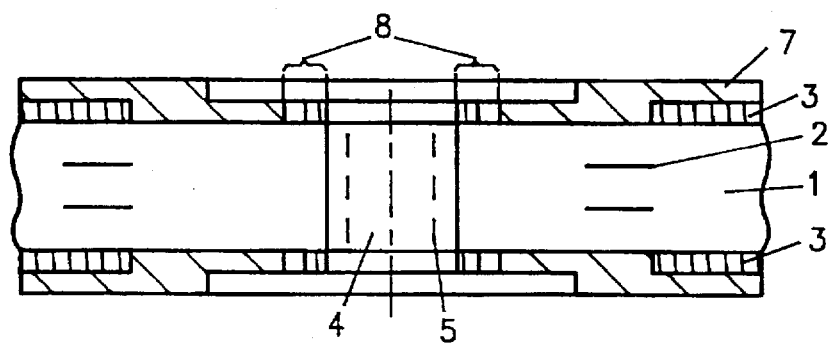
Figure 1H:
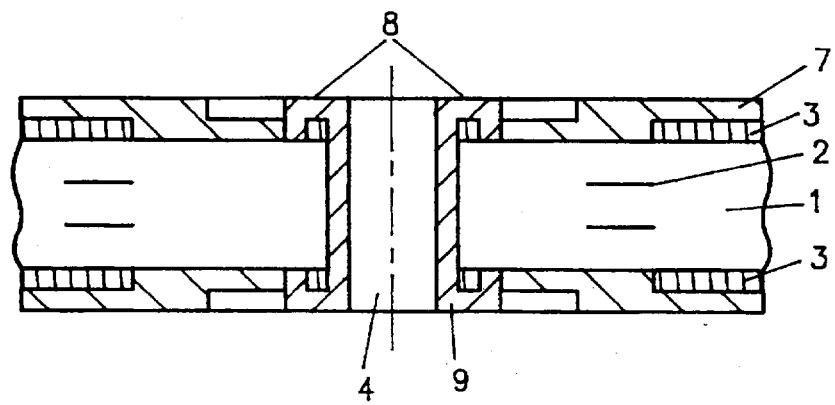

As shown in FIGS. 1A, 1B, 1C, 1D, 1E, 1F, 1G and 1H, the first process variant provides for a substrate 1 with all the inner layers 2 for the circuit board to be fabricated in a known manner by, say, lamination (steps a) and b)). Substrate 1 thus consists of insulating layers (e.g., FR-4, polyimide) and conductive layers (e.g., copper) which may be differently structured.

In step b) carried out simultaneously with step a), a metal foil 3, for example, a copper foil, of small thickness, generally less than 40 μm, is deposited, for example, by lamination on one or both surfaces of the substrate 1.

Then (step c)), holes 4 are formed in the substrate 1, which may be through or blind holes and which serve to connect the conductive layers. The holes may be drilled by mechanical and physical means (such as spiral drills and lasers). Suitable registration methods ensure that the holes 4 are correctly positioned relative to the inner layers 2. The holes are cleaned, for example, by chemical processes.

Then, the holes 4 are treated with a conditioning agent 5, such as gaseous sulphur trioxide, for 1 to 2 minutes at room temperature to be metallized later on (step d)). In response to the reaction between the conditioning agent 5 and the plastic surface, functional groups are formed which permit seeding with palladium nuclei (activation) and chemical metallization at a later stage. Compared with other, metallic, conditioning agents, $SO_3$ has the advantage that it is not electrically active. Consequently, when $SO_3$ is used, electronic effects which may lead to short-circuiting are eliminated in places where the conditioned regions are covered. In addition, the precious metal catalysts, such as $PD^{2+}$, deposited in the activation step, are most effectively bound by $SO_3$, which improves the adhesion of the chemical metallization.

In step e), photoresist 6 is deposited on the substrate surface, for which purpose the holes 4 should be covered (tented). The photoresists employed may be conventional ones, although dry resists, which can be deposited in thin layers and which are suitable for producing fine-line products, are the obvious choice. Using, for example, a mask, photoresist 6 is exposed and developed to form a pattern. Above and around the holes 4, photoresist 6 is retained and in the remaining regions of the substrate surface it defines the future conductors. In this step, too, care must be taken by registration methods that the future conductors are correctly positioned relative to the holes 4 and that the holes are well covered.

Then, using a suitable process, such as an etch process (step f)), metal foil 3 is removed from those regions where no photoresist 6 exists. In addition, photoresist 6 is removed. As a result, the conductor structures are transferred to the metal foil 3 and the contact areas, such as lands (annular contact areas surrounding the holes) and pads (contact areas without holes), are formed on the metal foil 3.

In step g), a solder stop mask 7 is applied to the surface of substrate 1, exposed and developed, removing the solder stop mask in particular above the holes 4 as well as around them in a region 8 comprising at least the metal foil retained there for forming a land. The remaining surface of the substrate 1 is covered by the solder stop mask 7 which may remain there also during later processing steps. Efficient registration must ensure that the holes in the solder stop mask 7 are correctly positioned.

Substrate 1, covered on the surface, with bared hole 4 and metal foil 3 along the hole edge 8 is then ready for metallization 9 which is carried out in step h). Metallization generally takes place in a chemical metal bath, such as a chemical copper bath, although there are also other metallization processes that may be used for this purpose. Prior to copper plating, for example, it may be advantageous to nickel-plate in a chemical nickel bath, as this improves the adhesion of the metallization 9 to substrate 1.

Such a process permits selecting the thickness of the metallization in the region of the holes 4 independently of that of the conductors. By a combination of additive and subtractive processes, the advantages of both may be combined. Compared with known processes, higher aspect ratios in the holes, i.e. a more uniform metallization also in deeper and smaller holes, are obtained. With copper foils, the variation of the layer thickness on the surface is noticeably smaller than with existing processes, wherein additional metal is applied to a metal foil by electrodeposition. In addition, compared with double layers consisting of a metal foil 3 and a metallization 9, less material is wasted when only the metal foil is structured.

Figure 2A:
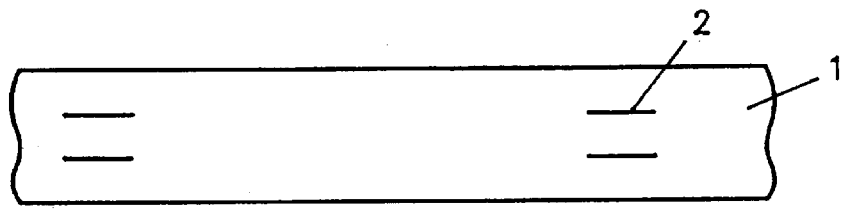
FIGS. 2A, 2B, 2C, 2D, 2E, 2F, 2G and 2H are steps of a process variant, wherein the hole is formed after completion of the conductors in a region from which the metal foil has not been removed.
Figure 2B:
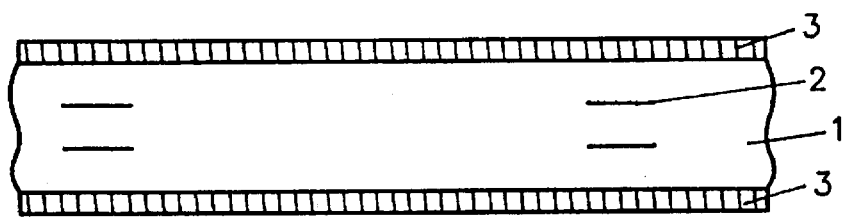
Figure 2C:
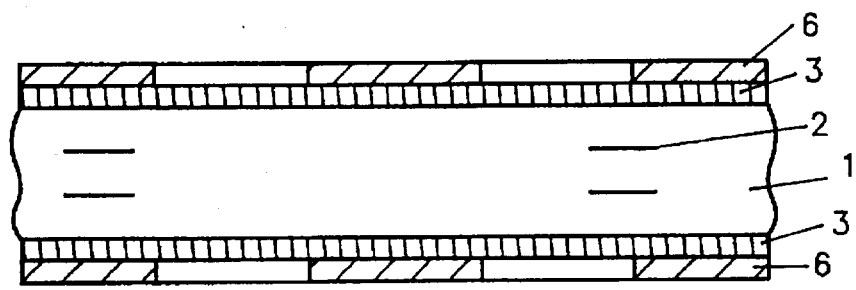
Figure 2D:
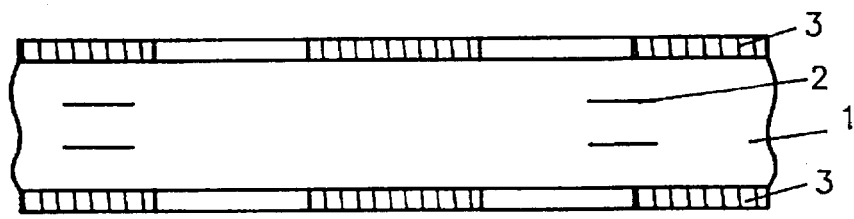
Figure 2E:
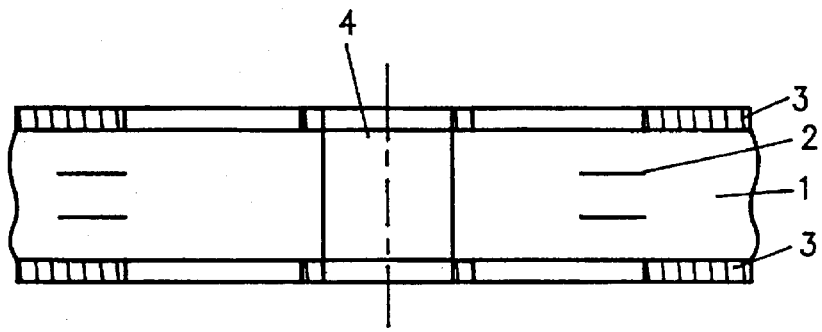
Figure 2F:
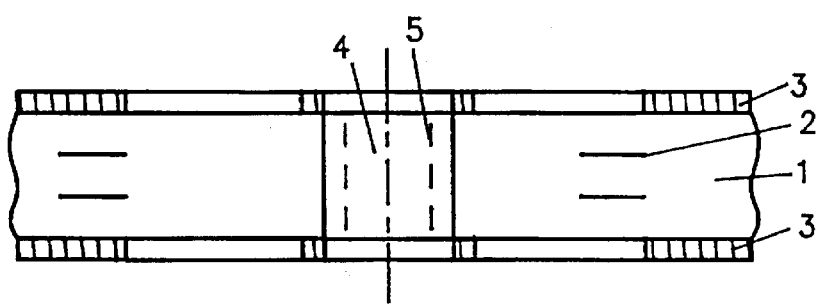
Figure 2G:
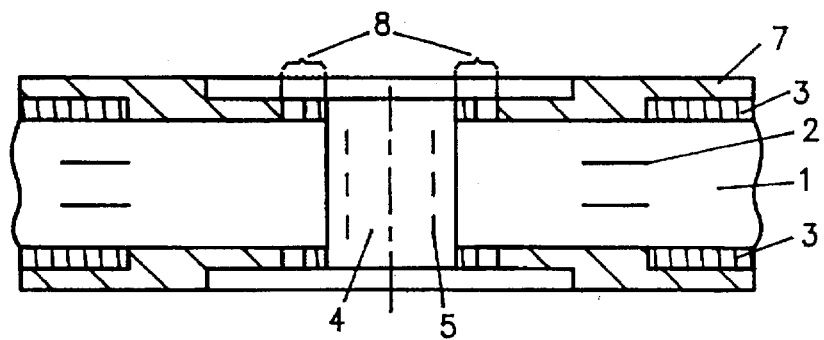
Figure 2H:
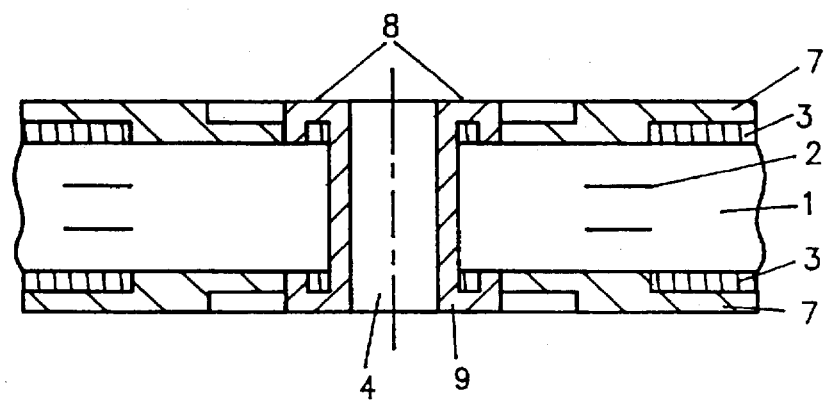
Figure 3A:
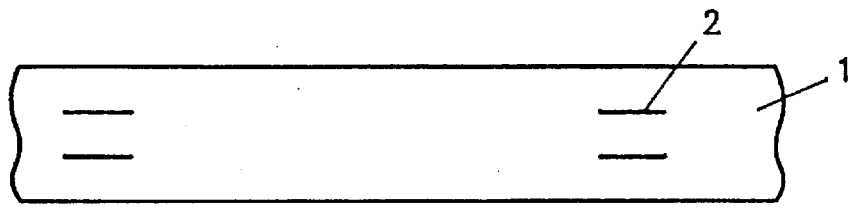
FIGS. 3A, 3B, 3C, 3D, 3E, 3F, 3G and 3H are steps of a process variant, wherein the hole is formed after completion of the conductors in a region from which the metal foil has been removed.
Figure 3B:
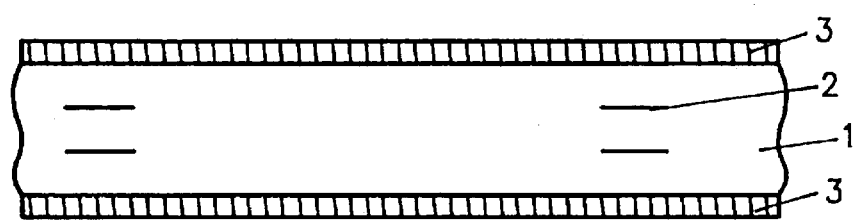
Figure 3C:
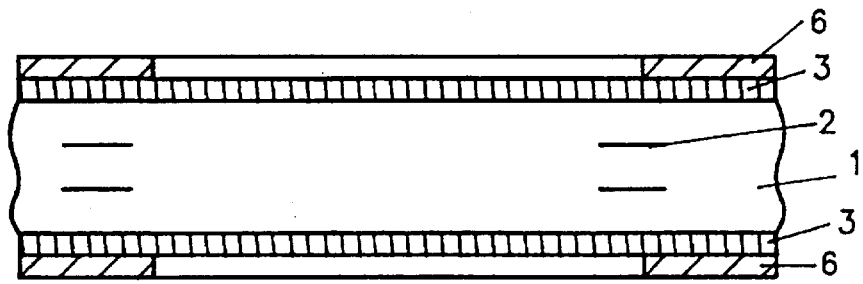
Figure 3D:
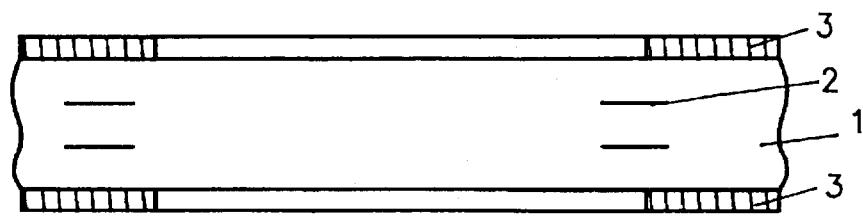
Figure 3E:
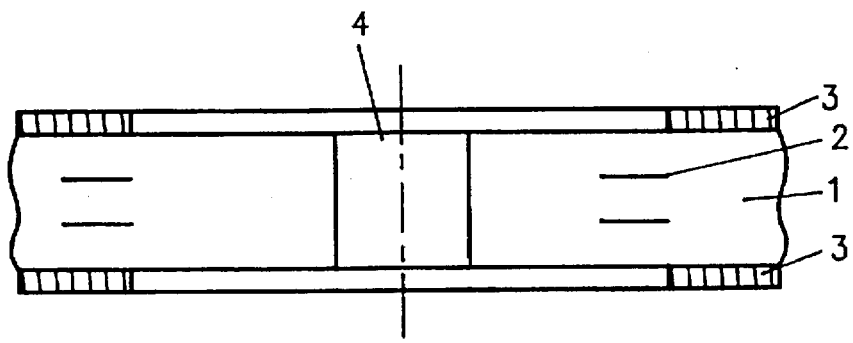
Figure 3F:
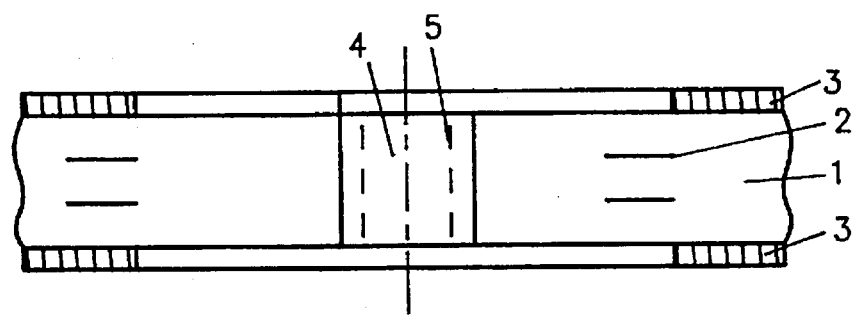
Figure 3G:
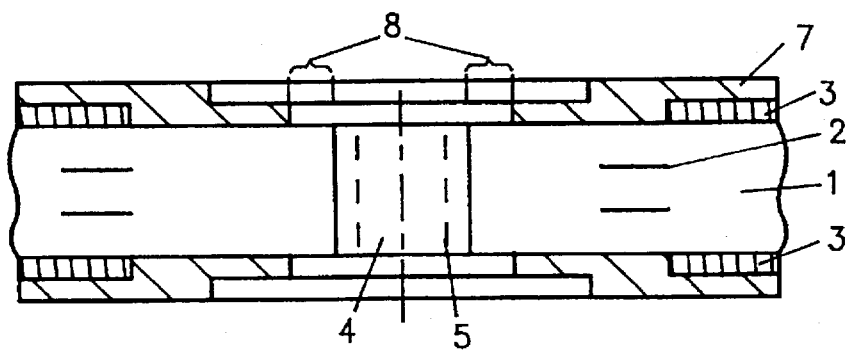
Figure 3H:
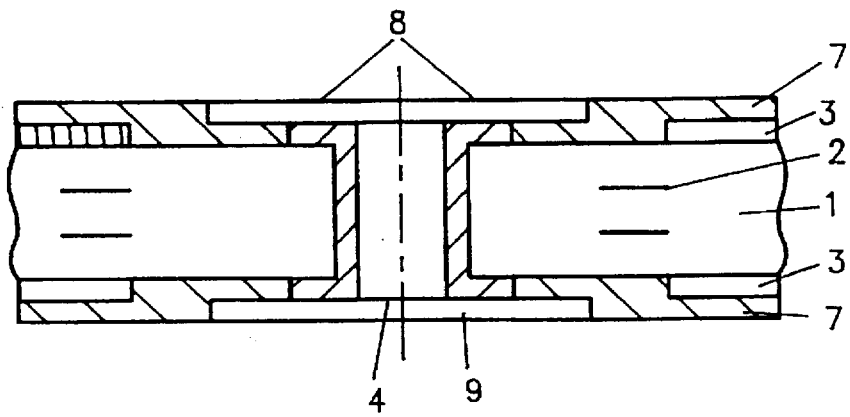

It is also possible to form the holes 4 in substrate 1 only after the conductors on the substrate surface have been completed. This variant is described with reference to FIGS. 2A, 2B, 2C, 2D, 2E, 2F, 2G, 2H, 3A, 3B, 3C, 3D, 3E, 3F, 3G, 3H. Steps a) and b) of the latter two variants—producing a substrate 1 with finished inner layers 2 and applying a metal foil 3 thereto—are identical with steps a) and b) of the first variant.

In step c) of the second variant (FIG. 2), photoresist 6 is applied to the surface of the substrate and exposed, so that, after exposure, photoresist 6 is retained in those regions in which a hole is to be formed later on.

In the following step d), the metal foil 3 is removed from the regions in which no photoresist 6 exists, and photoresist 6 is stripped off.

Then, holes 4—through or blind holes—may be formed in substrate 1 (step e)). As previously explained in connection with step c), the second variant provides for holes 4 to be formed in a region where photoresist 6 previously existed and which thus is still coated with metal foil 3.

In step f), analogously to step d) of the first variant, hole 4 is conditioned with a conditioning agent 5.

At the stage of step g) of the second variant, the conditions are the same as those in step g) of the first variant. The remaining process steps are identical.

Accurate registration must be ensured in several process steps, namely, during the fabrication of the conductors which have to be registered relative to the inner layers 2 through holes 4 and when the solder stop mask is bared relative to the position of the holes, pads, etc.

Compared with the first variant, this approach has the advantage that the holes do not have to be tented. As a result, a major error source during the fabrication of circuit boards is eliminated, as the relatively frequent occurrence of broken tents leads to failure and rejects (excessively etched holes).

For the third process variant FIGS. 3A, 3B, 3C, 3D, 3E, 3F, 3G, 3H), in contrast to the second variant, hole 4 is formed in step e) in a region of the substrate 1 from which metal foil 3 has been stripped. After conditioning (step f)), application of a solder stop mask 7 and metallization 9, which all proceed analogously to those of variant 2, there is no double layer of metal foil 3 and deposited metallization 9 in the region 8 surrounding the edges of the holes but only metallization 9.

This process allows producing all contact faces, such as lands and pads, in metallization step h). It is also suitable for what is known as a "landless design", i.e., for connecting the conductive material of the holes 4 directly to the conductors, which saves a considerable amount of space. Compared with the second variant, variant 3 has the advantage that there is no registration problem when the solder stop mask is bared for the lands. In addition, as all conductive structures on the surface of substrate 1 other than conductors are produced only in the final metallization step, variant 3 offers the possibility of eliminating the elaborate metallization step for components rejected after the critical drilling step.

All three process variants require a solder stop mask 7 which is not electroplated, which does not poison the copper bath and which is not electrolytically infiltrated. The solder stop mask 7 may be, for example, a solder-resistant photoresist, such as epoxy resin that can be photostructured.

The above-described processes permit the fabrication of circuit boards, wherein the layer thickness of the conductive material on the surface of the circuit board is independently selectable of the layer thickness of the conductive material in the holes. Thus, the layer thickness on the surface no longer has to exceed that in the holes but both are selectable according to technical expedience. This is shown in FIG. 4A, 4B, 4C, 4D where the conductive material 9 deposited in the hole, may be thinner (4B,4D) or thicker (4A,4C) then the conductive material 3 on the circuit board surface. The layer thicknesses of the conductors may range from, say, about 10 to 40 μm and in the holes from about 5 to 30 μm, with the form or preferably being, for example, about 15 to 18 μm and the latter about 23 to 28 μm. This yields superfine conductors on the surface of the circuit board and a good metallization of the holes and may be improved by a "landless" design as per variants 2 and 3, as space savings on the surface increase the wiring density still further.

I claim:

1. Process for fabricating a circuit board, comprising the steps of:

providing a substrate which includes a metal foil on a surface thereof;

forming a hole in the substrate;

treating a surface of the hole with a conditioning agent which results in the formation of functional groups on said surface of the hole, said functional groups enabling said surface to be seeded with a metallic catalyst and to be subsequently metallized;

coating a surface of the metal foil with photoresist and then exposing and developing the photoresist to form a pattern;

removing the metal foil exposed in places where there is no photoresist and then removing the photoresist pattern;

applying a solder stop mask to the surface of the substrate and then exposing and developing the solder stop mask to form a pattern which covers at least a portion of the metal foil and does not cover the holes; and depositing metallization in regions in which no solder stop mask exists.

2. The process of claim 1 in which the step of forming a hole in the substrate is performed before the step of coating the surface of the substrate with a photoresist; and in which the photoresist is patterned to cover the hole.

3. The process of claim 1 in which the step of removing the metal foil is performed prior to the steps of forming a hole and treating the hole.

4. The process of claim 3 in which the hole is formed in a region of the surface of the substrate in which the metal foil is not removed, during which process metal foil is retained around the hole, which is then metalized along with the hole.

5. The process of claim 3 in which the hole is formed in a region of the surface of the substrate in which the metal foil is removed, so that the region of the substrate surface at the hole is metalized.

6. The process of claim 1 in which the conditioning agent is gaseous $SO_3$.

7. The process of claim 1 in which the metal foil is a copper foil and the depositing is carried out with copper.

8. The process of claim 7 in which prior to depositing metallization, nickel is deposited.

9. The process of claim 1 in which:

the step of depositing metallization includes depositing 5 to 30 μm of conductive material.

10. The process of claim 1 in which:

the step of applying metal foil includes applying foil that is 10 to 40 μm thick.

11. The process of claim 1 in which:

the step of depositing metallization includes depositing 23 to 28 μm of conductive material.

12. The process of claim 9 in which:

the step of depositing metallization includes the step of depositing metallization to the applied foil until the combined thickness of the foil and metallization is about 15 to about 70 μm.

13. The process of claim 9 in which:

the step of depositing metalization includes the step of depositing metalization to the applied foil until the combined thickness of the foil and metalization is about 38 to about 46 μm.

14. The process of claim 1 further comprising the step:

depositing nickel on the metal foil.

15. The process of claim 14 in which further comprising the step of:

depositing nickel on the metal foil around the hole before depositing metalization.

16. The process of claim 1 further comprising the step of:

depositing nickel only immediately around holes in the copper foil.

17. The process of claim 1 in which the step of depositing metalization is limited to depositing metalization with a thickness which is less than the thickness of the metal foil.

18. The process of claim 1 in which the applied metal foil is copper.

19. The process of claim 1 in which the step of depositing metalization includes chemically depositing copper.

20. The process of claim 14 in which the step of depositing nickel includes chemically depositing nickel.

21. The process of claim 1 in which the step of depositing metalization only deposits metal in the holes.

22. The process of claim 1 in which the step of depositing metalization includes electrolytically depositing copper.

23. The process of claim 1 in which the step of forming a hole includes forming the hole through the substrate.

24. The process of claim 1 in which the process of depositing metalization includes depositing metalization in the holes and depositing a different thickness of metalization on the metal foil including metalization applied to the foil prior to applying the solder stop mask.

25. The process of claim 1 in which the step of removing the exposed metal foil includes etching the foil at the holes.

26. The process of claim 1 further comprising the step of connecting a surface conductor to deposited metalization in the hole without any intervening land.

27. The process of claim 1 further comprising the step of providing a land of metal around the hole connected to deposited metalization in the hole and connecting a surface conductor to the land.

28. The process of claim 1 in which the conditioning agent is electrically non-active.

29. The process of claim 1 in which the conditioning agent reacts with the organic surface of the hole to form functional groups which facilitate seeding and chemical metalization.

30. The process of claim 12 in which the depositing metalization continues until the combined thickness of the foil and metalization is about 38 to about 46 μm.

31. The process of claim 5 further comprising depositing metal on the foil prior to coating the surface with solder stop mask.

32. The process of claim 7 in which depositing conductive metal includes depositing metal after the exposing and developing the stop mask on the dielectric walls of the holes.

* * * * *